United States Patent
Keskin

(10) Patent No.: US 7,106,239 B1
(45) Date of Patent: Sep. 12, 2006

(54) RAIL-TO-RAIL DELAY LINE FOR TIME ANALOG-TO-DIGITAL CONVERTERS

(75) Inventor: Mustafa Keskin, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 11/197,172

(22) Filed: Aug. 3, 2005

(51) Int. Cl.
*H03M 1/60* (2006.01)

(52) U.S. Cl. ..................... 341/157; 341/155

(58) Field of Classification Search ................. 341/157
See application file for complete search history.

(56) References Cited

U.S. PATENT DOCUMENTS

| | | | | |
|---|---|---|---|---|
| 5,396,247 A | * | 3/1995 | Watanabe et al. | 341/157 |
| 6,653,964 B1 | * | 11/2003 | Mizuno et al. | 341/155 |
| 6,850,178 B1 | * | 2/2005 | Watanabe | 341/155 |
| 6,958,721 B1 | * | 10/2005 | Vincent et al. | 341/157 |

OTHER PUBLICATIONS

Watanabe, Takamot:An All-Digital Analog-to-Digital Converter With 12-μ V/LSB Using Moving-Average Filtering: IEEE Journal of Solid-State Circuits, vol. 38, No. 1 (Jan. 2005)pp. 120-125.
Watanabe, Takamot:An All-Digital PLL for Frequency Multiplication by 4 to 1022 With Seven-Cycle Lock Time: IEEE Journal of Solid-State Circuits, vol. 38, No. 2 (Feb. 2003)pp. 198-204.

* cited by examiner

*Primary Examiner*—Rexford Barnie
*Assistant Examiner*—Khai Nguyen
(74) *Attorney, Agent, or Firm*—Philip R. Wadsworth; Charles D. Brown; Kenyon S. Jenckes

(57) ABSTRACT

A time-analog-to-digital converter (TAD) utilizes a time-to-digital approach for analog-to-digital conversion. The TAD includes two voltage-to-delay converters (VDCs), e.g., CMOS inverter chains, in order to increase the dynamic range of the TAD. Each VDC can handle a different range of input voltages. Comparators compare the input signal voltage to reference voltages corresponding to the different ranges of input voltage and a selector selects one of the VDC line outputs based on the range in which the input signal lies. A filter estimates the input signal voltage from a delay signal from the selected output.

8 Claims, 6 Drawing Sheets

RAIL-TO-RAIL DELAY LINE FOR TIME ANALOG-TO-DIGITAL CONVERTERS

BACKGROUND

Time-to-digital converters (TDCs) are digital circuits that measure the delay of a pulse signal and convert this delay directly into a digital signal. TDCs are widely used in precision time measurement instruments. TDCs may be produced using CMOS (Complementary Metal Oxide Semiconductor) processes, which are becoming increasingly prevalent in the semiconductor industry.

A time-analog-to-digital converter (TAD) is an analog-to-digital converter (ADC) that is implemented using time-to-digital conversion techniques. In one type of TAD, a variable delay is first extracted from the input signal, and this delay is then measured (digitized) by digital elements. The digital elements include a chain of delay units (DUs), which form a delay line. The DUs may be, e.g., CMOS inverters. This approach differs from conventional ADCs in that the entrance of the input signal is to a sampling stage and no analog devices are used.

In one type of TAD, the input signal is connected to the positive supply terminal, Vdd, of the inverters. A clocked pulse is applied to the gate of the first inverter in the delay line in order to obtain variable delays on the input pulse through the Vdd terminal, where the input signal is connected. After the signal dependent delay on the output pulse is obtained, the delay is digitized using a time-to-digital approach. Because no sample-and-hold circuit is needed, an all-digital design is possible. However, the input signal range to be digitized is limited due to the threshold values of devices in the delay line. Input voltages at the Vdd terminal lower than the threshold voltages of the PMOS and NMOS devices in the DUs (inverters) create a dead region in the conversion.

SUMMARY

In an embodiment, a TAD utilizes a time-to-digital approach for analog-to-digital conversion. The TAD includes two delay lines which may include, e.g., CMOS inverter chains. Each delay line is connected to two supply lines. The supply lines for one delay line are connected to a higher potential supply line, e.g., Vdd, and the input signal voltage, respectively, and the supply lines of the other delay line are connected to the input signal voltage and a lower potential supply line, e.g., Vgnd, respectively. Each delay line is used to handle a different range of input voltages, thereby increasing the dynamic range of the TAD.

Each delay line may include a buffer between the chain of inverters and its output. Comparators may be used to compare the input signal to a first threshold voltage corresponding to a first range of input signal voltages and to a second threshold voltage corresponding to a second range of input signal voltages.

A clocked pulse is applied to each delay line, each delay line producing a signal dependent delay signal at its output. A selector selects the delay signal from the output from one of the delay lines based on the range of voltages in which the input signal lies. A filter then estimates the input signal voltage from the delay signal from the selected delay line output.

DETAILED DESCRIPTION

As described above, one type of TAD utilizes a delay line including a chain of DUs, e.g., CMOS inverters. In operation the delay time between the input pulse and the output pulse is modulated by the input signal voltage. The number of DUs in the chain through which the input pulse passes within a sampling (integration) time is then output as conversion data.

Figure 1A:
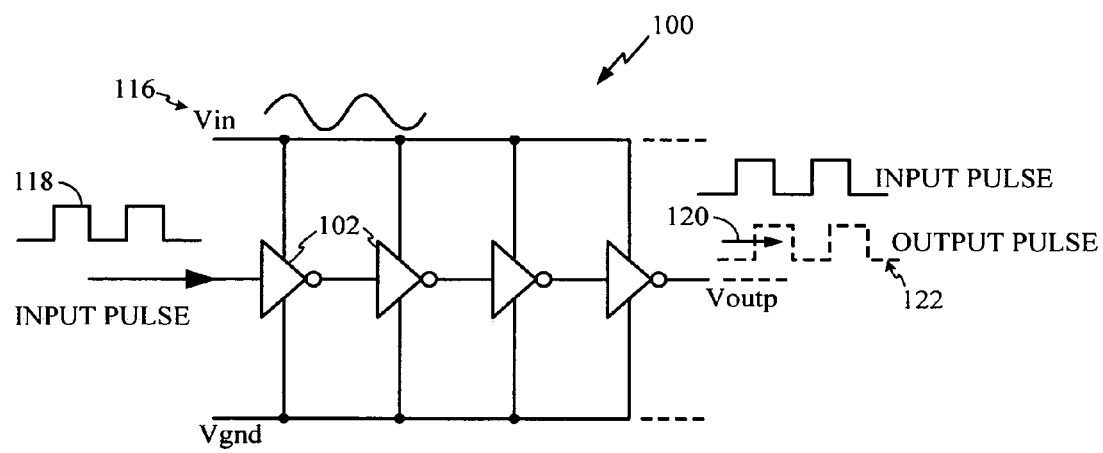
FIG. 1A is a schematic diagram of a delay line including a chain of DUs according to an embodiment.
Figure 1B:
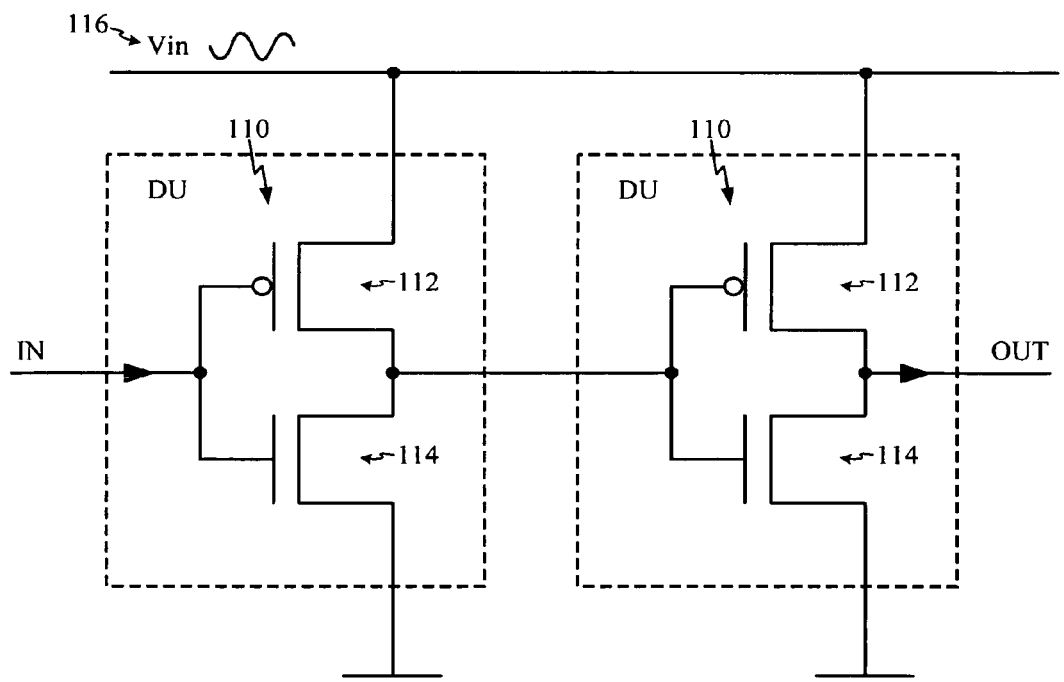
FIG. 1B is a schematic diagram showing a more detailed view of DUs in FIG. 1A.

FIG. 1A shows a delay line 100, also referred to as a voltage-to-delay converter (VDC), which may be used in the TAD. DUs 102 in the delay line may be CMOS inverters 110, each of which includes a PMOS transistor 112 and an NMOS transistor 114, as shown in FIG. 1B. In this TAD, the variable delay is introduced by using the input signal 116 as Vdd for the inverters in the chain. A clocked pulse 118 is also applied to the gate of the first inverter in the delay line in order to obtain variable delays on the output pulse through the Vdd terminal, where the input signal is connected. After the signal dependent delay 120 on the output pulse 122 is obtained, the delay is digitized using a time-to-digital approach.

One drawback of this TAD occurs when the input signal is lower than the threshold voltages of the PMOS and NMOS devices in the inverter cells. An Hspice simulation was performed for the circuit 100 shown in FIG. 1A. For this simulation, the pulse clock frequency was 4-MHz and the input signal (Vin) was applied from 0V at t=0 µs to 2.6V at t=2 µs as a ramp signal.

Figure 2:
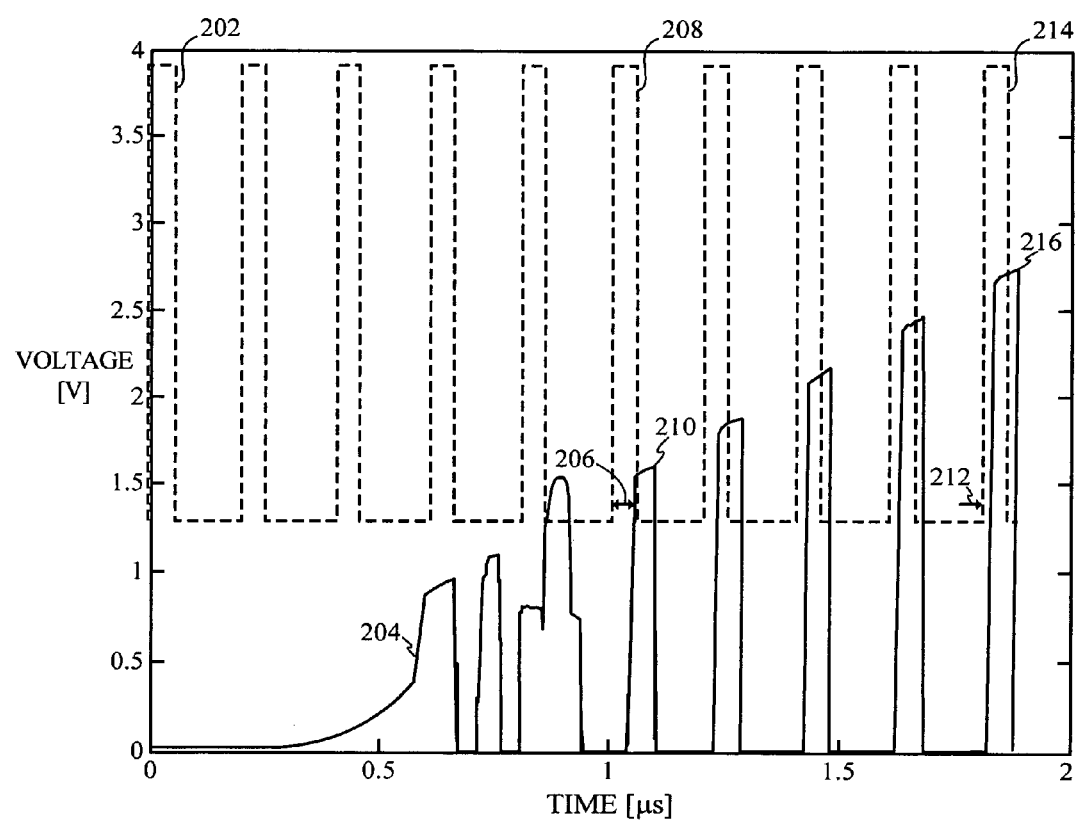
FIG. 2 is a plot showing the results of a simulation utilizing the circuit shown in FIG. 1.

The results of the simulation are shown in FIG. 2. The input pulse 202 (dashed line) is shifted up in the figure for clarity, however, the signal actually swings from 0 (Vgnd) to 2.6V (Vdd). The straight line 204 is the output signal of the delay line. As clearly shown in this plot, the clock-edge-delay varies with the input signal Vin. For example, the delay 206 from input pulse 208 to output pulse 210 at approximately 1.1 µs is larger than the delay 212 from input pulse 214 to output pulse 216 at approximately 1.8 µs, where the input voltage at Vdd is higher at 214 than at 208. This plot clearly shows that conversion suffers for signals below the threshold voltage of 0.8V, especially for signal levels closer to 0V.

Figure 3:
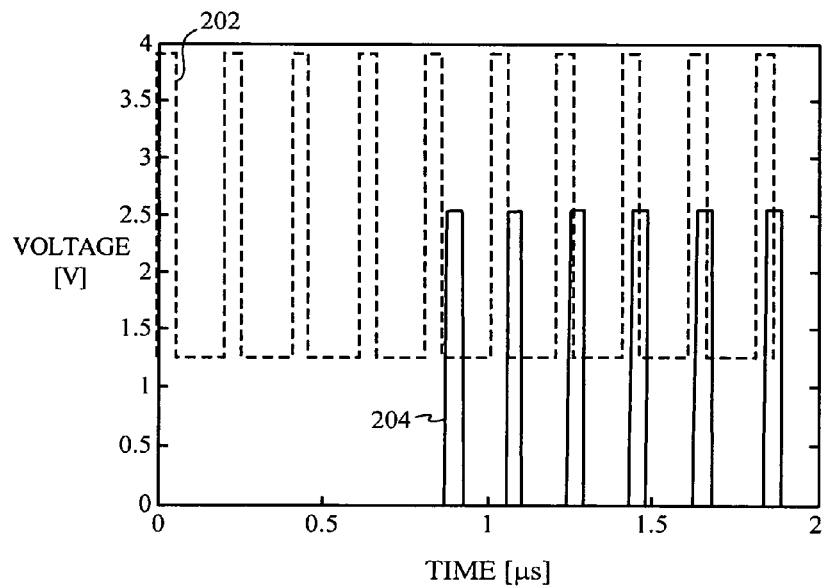
FIG. 3 is a plot showing the results of a simulation utilizing the circuit shown in FIG. 1 in combination with a buffer circuit.

A buffer (e.g., two inverters in series) with a regular supply voltage of 2.6V was added to the output to extract meaningful delay information for input signals from 0.8V to 2.6V, as shown in FIG. 3. However, as shown in the plot, the output pulse cannot be recovered properly for input signals lower than 0.8V.

Figure 4:
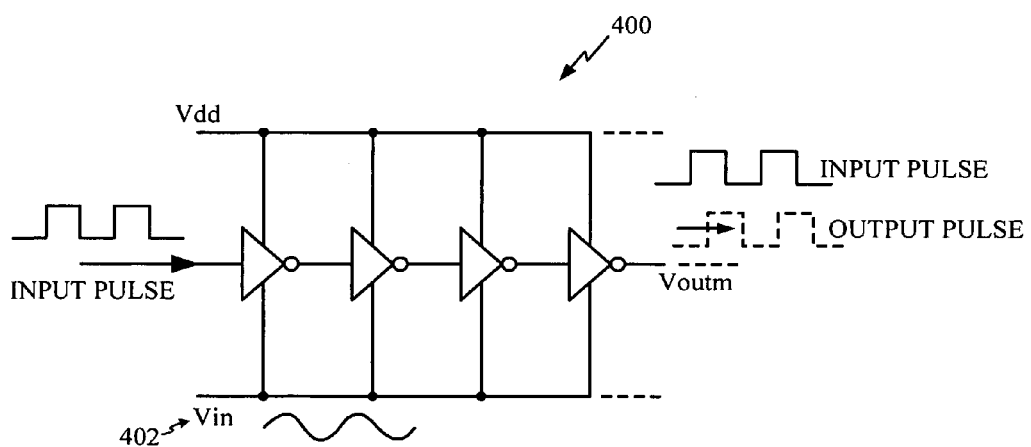
FIG. 4 is a schematic diagram of an inverter chain according to another embodiment.
Figure 5:
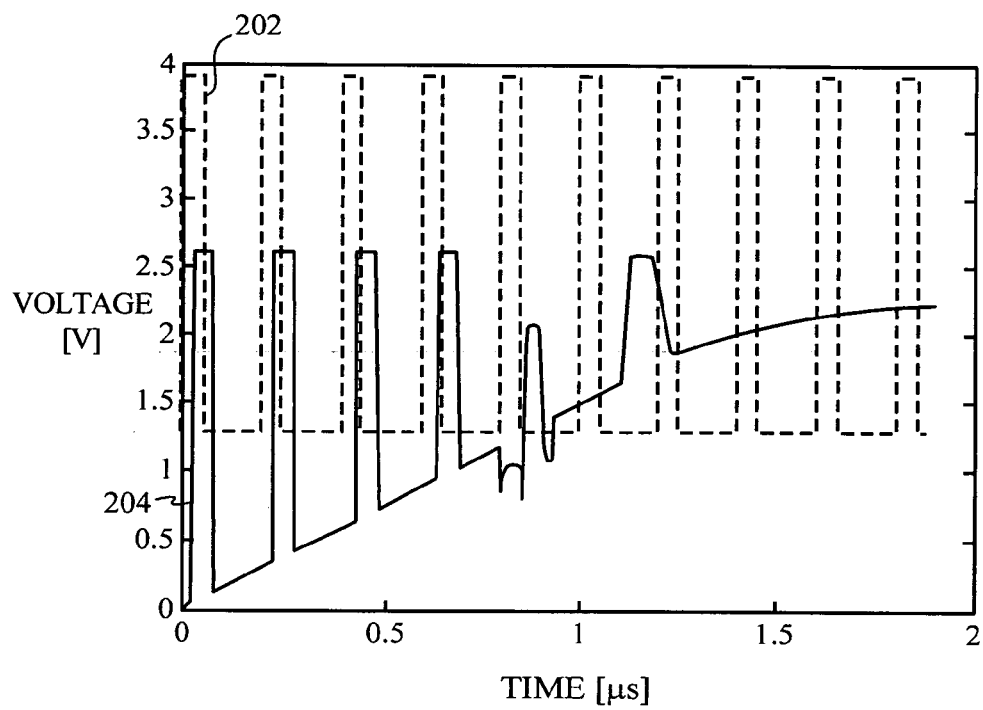
FIG. 5 is a plot showing the results of a simulation utilizing the circuit shown in FIG. 4.
Figure 6:
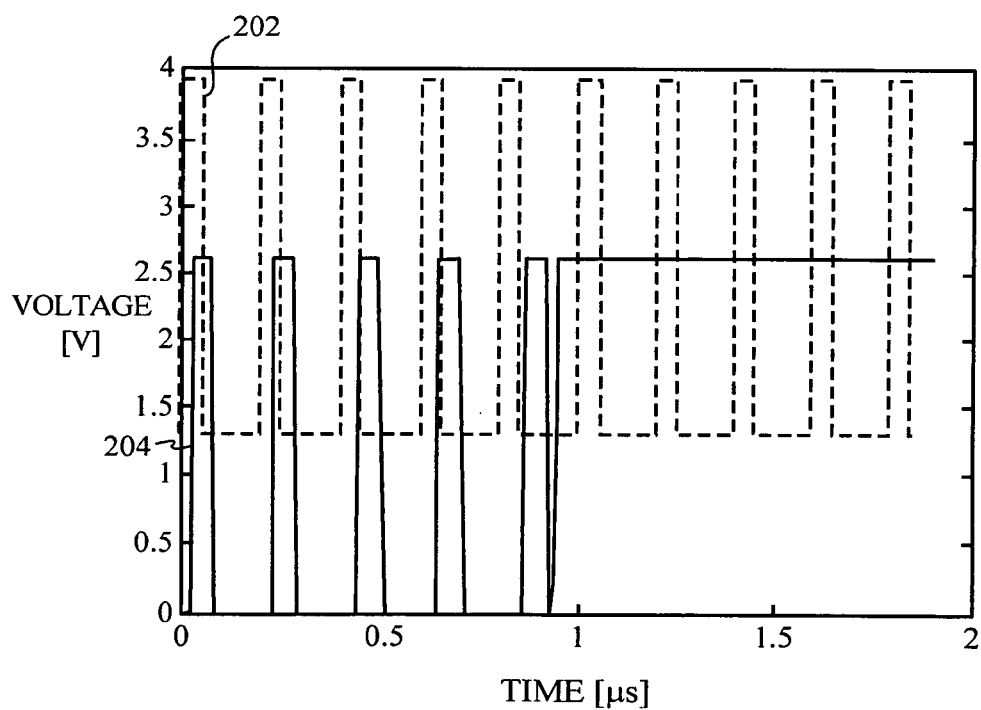
FIG. 6 is a plot showing the results of a simulation utilizing the circuit shown in FIG. 4 in combination with a buffer circuit.

In an embodiment, the dynamic range of the TAD is improved by adding an additional VDC circuit. In one VDC the input signal replaces the positive supply voltage (Vdd), as shown in FIG. 1A, and in the other VDC 400 the input signal 402 replaces the negative supply voltage (Vgnd), as shown in FIG. 4. FIG. 5 shows the simulation result for the VDC 400 shown in FIG. 4. The simulation conditions for FIG. 5 are the same as that of FIG. 2 except for the introduction of the input signal to these delay lines. As shown in the FIG. 5, by using Vin as Vgnd, signals below 0.8V can be converted whereas conversion suffers for signals above 1.8V (=2.6V–0.8V), especially for signal levels closer to 2.6V. FIG. 6 shows the resulting digital output signal that appears after a buffer with a regular supply voltage of 2.6V was added to the output.

Figure 7:
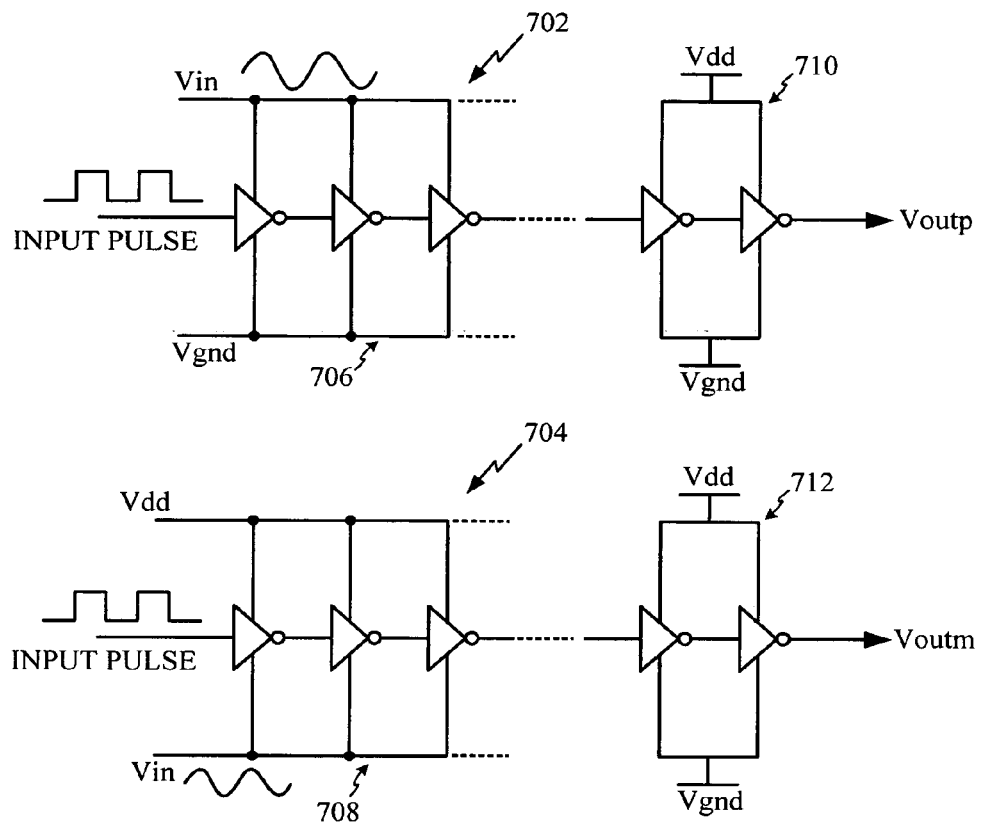
FIG. 7 is a schematic diagram of dual delay lines for use in a TAD according to an embodiment.

FIG. 7 shows the two delay lines 702 and 704, each including a VDC 706, 708 and a buffer 710, 712. The output signal of VDC 706, with Vin at the positive supply rail of the inverters in the chain, is labeled Voutp, and the output signal of the VDC 708, with Vin at the negative supply rail of the inverters in the chain, is labeled Voutm.

Figure 8:
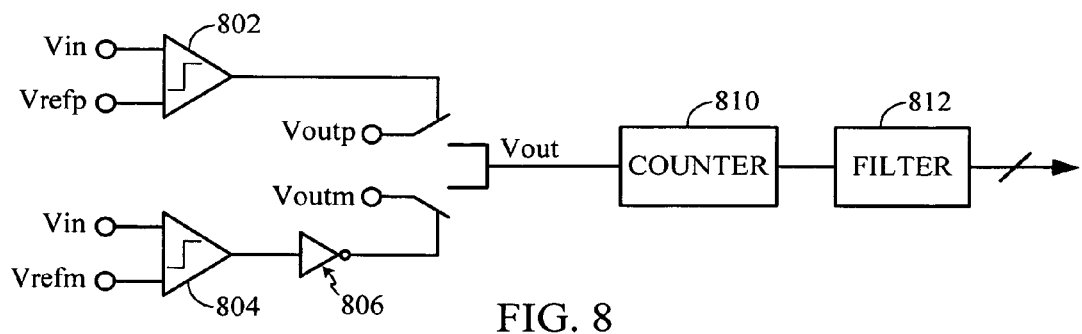
FIG. 8 is a schematic diagram of a comparator for use with the dual delay lines shown in FIG. 7.

As shown in FIGS. 3 and 6, Voutp provides best results for input signals above about 0.8V, and Voutm provides best results for input signals below about 1.8V. The appropriate output may be selected from Voutp and Voutm using two comparators 802 and 804, as shown in FIG. 8. These comparators create two enable signals, either passing Voutp or passing Voutm, where the enable signal for Voutm is inverted by an inverter 806. The threshold of these comparators, Vrefm and Vrefp, can be selected as, e.g., 1.2V and 1.4V, which will allow both of the VDC circuits a smooth transition around the mid-point of the supply rail. These levels can be adjusted based on the desired delay-voltage curvature. A counter 810 determines the delay by counting the number of DUs the input pulse passes through during an integration interval. A filter 812 coupled to the comparators 802, 804 uses this information and the identity of the selected delay line to estimate the input voltage corresponding to the measured delay.

Figure 9:
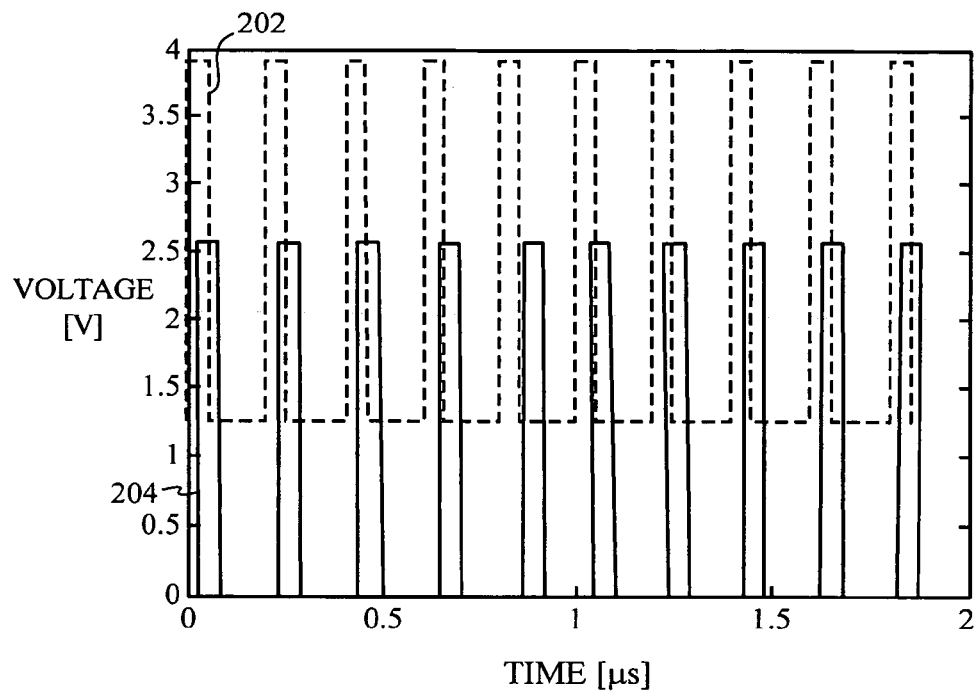
FIG. 9 is a plot of the results of a simulation of a TAD utilizing the circuits shown in FIGS. 7 and 8.

FIG. 9 shows the results of a simulation using the circuits shown in FIGS. 7 and 8. As shown in the plot, delay-voltage readings are produced for the full range of 0V to 2.6V.

Figure 10:
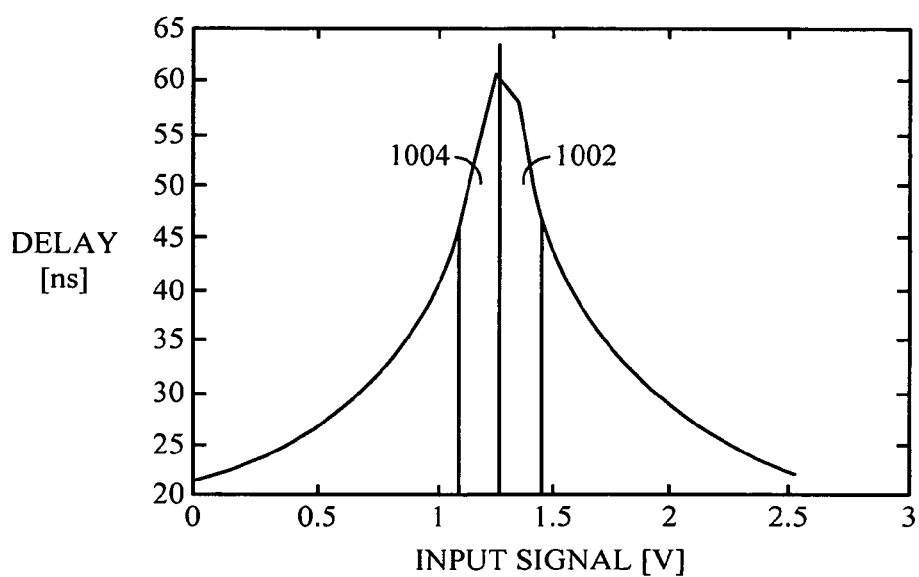
FIG. 10 is a plot showing the voltage-to-delay response of the TAD used in FIG. 9.

FIG. 10 shows a plot of the delay (from input pulse to output pulse) vs. input signal voltage. The ranges of operation are shown in region 1002 for VDC1 and region 1004 for VDC2. As described above, the thresholds for the comparators may be adjusted based on the desired delay-voltage curve. In an alternative implementation, the results from both VDCs may be used in regions 1002 and 1004 and averaged to provide a more accurate reading. Again, the thresholds may be adjusted for the desired curve.

The TAD may be used as an alternative to standard ADCs in a variety of applications.

A number of embodiments have been described. Nevertheless, it will be understood that various modifications may be made without departing from the spirit and scope of the invention. Accordingly, other embodiments are within the scope of the following claims.

The invention claimed is:

1. A time-analog-to-digital converter (TAD) comprising:
   a first delay line coupled to an input signal voltage and having a first output;
   a second delay line coupled to the input signal voltage and having a second output;
   a selector to select the first output for a first range of input signal voltages and to select the second output for a second range of input signal voltages; and
   a filter to estimate the input signal voltage from a delay signal from the selected output.

2. The TAD of claim 1, wherein the first delay line comprises a first chain of inverters, and
   wherein the second delay line comprises a second chain of inverters.

3. The TAD of claim 2, wherein the first delay line includes a buffer between the first chain of inverters and the first output, and
   wherein the second delay line includes a buffer between the second chain of inverters and the second output.

4. The TAD of claim 2, wherein the first chain of inverters are coupled between a first supply line and a second supply line,
   wherein the second chain of inverters is coupled between a third supply line and a fourth supply line,
   wherein the second supply line and the third supply line are coupled to the input signal voltage,
   wherein the first supply line is coupled to a first supply voltage and the fourth supply line is coupled to a second supply voltage, and
   wherein the first supply voltage has a higher potential than the fourth supply voltage.

5. The TAD of claim 1, wherein the first supply voltage comprises Vdd.

6. The TAD of claim 1, wherein the second supply voltage comprises Vgnd.

7. The TAD of claim 1, wherein the selector comprises:
   a first comparator to compare the input voltage signal to a first reference voltage; and
   a second comparator to compare the input voltage signal to a second reference voltage.

8. The TAD of claim 7, wherein the first reference voltage corresponds to an endpoint of the first range of input signal voltages, and
   wherein the second reference voltage corresponds to an endpoint of the second range of input signal voltages.

* * * * *